United States Patent [19]

Ragonese et al.

[11] 4,163,244
[45] Jul. 31, 1979

[54] SYMMETRICAL INTEGRATED INJECTION LOGIC CIRCUIT

[75] Inventors: Louis J. Ragonese; Neng-Tze Yang, both of Liverpool, N.Y.

[73] Assignee: General Electric Company, Syracuse, N.Y.

[21] Appl. No.: 846,375

[22] Filed: Oct. 28, 1977

[51] Int. Cl.² ............................................ H01L 27/04
[52] U.S. Cl. ...................................... 357/44; 357/36; 357/20; 357/46; 357/92
[58] Field of Search .................... 357/44, 46, 20, 92, 357/36

[56] References Cited

U.S. PATENT DOCUMENTS

| 3,736,477 | 5/1973 | Berger et al. | 357/92 |
| 3,961,351 | 6/1976 | Blatt | 357/92 |
| 3,993,918 | 11/1976 | Sinclair | 357/92 |
| 4,084,174 | 4/1978 | Crippen et al. | 357/92 |

OTHER PUBLICATIONS

Blatt et al., "Substrate Fed Logic," IEEE J. of Solid-State Circuits, vol. SC-10, No. 5, Oct. 1975, pp. 336-342.
DeTroye, "Integrated Injection Logic . . . ," IEEE J. of Solid-State Circuits, vol. SC-9, No. 5, Oct. 1974, pp. 206-211.
Kerns, "Effect of Base Contact Position...," IEEE J. of Solid-State Circuits, vol. SC-11, No. 5, Oct. 1976, pp. 712-717.

Primary Examiner—William D. Larkins
Attorney, Agent, or Firm—Richard V. Lang; Carl W. Baker

[57] ABSTRACT

The invention relates to an improved integrated injection logic circuit suitable for large scale integration. In integrated injection logic the fundamental circuit unit is a bipolar transistor having a unitary base and a unitary emitter with a plurality of electrically separate collectors used in combination with a complementary bipolar transistor for base current injection. Typically, the collector of the injector is integral with the base of the first transistor. By a novel symmetric arrangement of the individual collectors in respect to both base contacts and injectors, the response of the individual collectors is closely matched even at relatively high current levels.

13 Claims, 9 Drawing Figures

SYMMETRICAL INTEGRATED INJECTION LOGIC CIRCUIT

BACKGROUND OF THE INVENTION

1. Field of the Invention

The present invention relates to integrated injection logic, a circuit technique implemented with bipolar transistors fabricated by conventional integrated circuit processes. The invention relates to the topology or physical arrangement of the circuit features on the integrated circuit including the disposition of the individual transistor regions, the internal current paths, and the external contacts. A novel topology is shown which improves the uniformity of electrical response in individual circuit units and in collections of such circuit units.

2. Description of the Prior Art

Integrated injection logic ($I^2L$) has been described in the literature, as for instance Hart, C. M. and Slob, A., "Integrated Injection Logic—A New Approach to LSI", 1972 IEEE International Solid State Circuits Conference Digest of Technical Papers, pp 92-93, and Berger, H. H. and Wiedmann, S. K., "Merged Transistor Logic—A Low Cost Bipolar Logic Concept", 1972 ISSCC Digest of Technical Papers, pp 90-91. In addition, certain practical devices using the $I^2L$ technique have been marketed by at least two major semiconductor manufacturers.

The technique has several attractive features. One desirable feature of the technique is that the speed power product is very small, being demonstrated at less than 1.0 picojoules. This figure is an order of magnitude better than most conventional techniques including "CMOS", "Schottky-TTL", "TTL", "ECL", etc. In addition to its excellent speed power product, it seems to have the potential of achieving radiation hardness compatible with a majority of severe applications. In addition, because it can use conventional linear bipolar devices, the fabrication processes are conventional and manufacturing costs are relatively inexpensive.

Integrated injection logic is based on the idea of operating conventional integrated bipolar transistors in an inverted mode. In $I^2L$ logic, NPN transistors which consist of successively stacked horizontal layers have their emitter layer lowermost, the base layer above the emitter, and the collector layer topmost, usually in separate islands within the base. The resultant multiple collector device is compact and, when supplied with an appropriate base biasing current source or "injector", constitutes a basic "NOR" type gate building block. The "NOR" function results when the collectors of different multiple collector devices are connected together. The current source used to bias the base of the $I^2L$ multi-collector NPN transistors can be realized in many ways. The most popular $I^2L$ configuration uses a lateral PNP transistor as the base biasing source. A less popular configuration uses a vertical PNP injector arranged beneath the NPNs.

In practical devices utilizing both arrangements, there is a general variation in the response of individual collectors.

SUMMARY OF THE INVENTION

Accordingly, it is an object of the present invention to provide an improved integrated injection logic circuit unit.

It is a further object of the present invention to provide an integrated injection logic circuit unit having an improved uniformity of dc current output response.

Still another object of the present invention is to provide an integrated injection logic circuit unit having a more uniform transient time response of the individual collectors to base control.

An additional object of the present invention is to provide an integrated injection logic circuit unit having more uniform base current injection to the individual collectors.

Still another object of the present invention is to provide an integrated injection logic circuit unit having improved topology.

These and other objects of the invention are achieved in a novel combination for use in an integrated injection logic circuit comprising a vertical transistor means and a complementary transistor means. The vertical transistor means comprises an underlying contact region of low resistivity and typically of an n type material, a first emitter region of typically n type material lying above the contact region, a first base region of p type material lying above the first emitter region, and a plurality of separate first collector regions of n type material. The emitter and base regions form an input junction. The collector regions which are disposed on top of, and horizontally bounded by a continuation of the p type material of which the first base region is formed, form a plurality of separate output junction regions. The construction results in a plurality of incremental vertical transistors localized under the collector regions. In accordance with the invention, the first collector regions are arranged at substantially equal horizontal distances from a first center of symmetry at which a base contact is applied. This provides a matched collector current transient response to base control.

The complementary transistor means, typically a PNP transistor, injects base current into the vertical transistor means. The injector comprises a second collector region of a p type material, which is formed as a continuation of the material of the first base region to provide the current injection path; a second base region of n type material in contact with the underlying contact region and next to the second collector region to form an injector output junction region; and a second emitter region of p type material next to the second base region to form at least one injector input junction region.

In one form of the invention, the complementary transistor means has its second emitter, second base and second collector regions vertically oriented in respect to the substrate to provide horizontal current injection paths to the vertical transistor means.

In a first portion of a practical cell using horizontal current injection, the vertical transistor means may have four incremental transistors and the complementary transistor means two injector transistors, one injector being for one adjacent pair of incremental transistors, and the other for the other adjacent pair of incremental transistors. In accordance with the invention, the injection transistors are placed equidistant from the pairs of incremental transistors to equalize the current injection paths.

In a modification, the two injection transistors in the first portion of a practical cell may each be provided with two separate base regions to form four matched horizontal current injection paths to the four incremental transistors of a single vertical transistor means. This injection arrangement is particularly useful when the vertical transistor means has an X-shaped base region, with the collector regions disposed in each arm and the base contact at the center. The separate injection transistors are then arranged centered in two opposite angles of the "X", to equalize the current injection paths.

In another portion of the same practical cell, two vertical transistor means may be provided in close horizontal association on the same substrate, each having at least one pair of incremental transistors. Typically, one vertical transistor means has two incremental transistors and the other four, or both two, or both four. At least one pair of incremental transistors from each vertical transistor means are then disposed at substantially equal horizontal distances from a second center of symmetry. When the complementary injection transistor means is placed at the second center of symmetry, four current injection paths to the four incremental transistors are equalized.

When the vertical transistor means comprises two incremental transistors, the base regions may be V-shaped. When two such V-shaped vertical transistor means are associated, the angles of the V-shaped base regions are adjoined to define a rhombus or square. A second center of symmetry is formed at the center of this rhombus or square. When the complementary current injection transistor means is at this second center, the current injection paths are equalized. When two associated vertical transistor means comprise respectively four and two incremental transistors, one of the base regions is X-shaped and the other V-shaped. In this situation, the angles of the base regions are adjoined to define a rhombus or square as before. The complementary current injection transistor means is placed at the center of this figure to equalize the current paths.

In a second practical cell, the base regions of each vertical transistor means are approximately rectangular. The associated vertical transistor means are aligned along a common axis with the base contacts lying on the axis and with the one axis of each rectangle in alignment with the common axis. A transistor means having four collector regions occupies a rectangle of approximately twice the axial dimension of a transistor means having two collector regions. The current injection means are also located along the axis at equal distances from each base region. When the base region is rectangular, the injection means may be provided with either one or two axially oriented current injection paths as needed.

In the arrangements described above in which horizontal current injection paths are provided, the original substrate less the epitaxial layer is of degeneratively doped n+ material and the original epitaxial layer is of n material into which successive P and N diffusions take place. The original substrate is the emitter contact, and the active regions of the NPN and PNP devices are in the epitaxial layer.

The invention is also applicable to a substrate fed current injection arrangement. In that arrangement, the original substrate is normally of a p type material and the original epitaxial layer is of n type material. This permits both the NPN and the complementary PNP injector to be vertical. In this arrangement, the first layer of p material in the original substrate forms the injector emitter region while the second layer of n material, which is in the epitaxy, forms the injector base region. A patterned, third layer of p material is formed above the second n layer and a fourth, patterned layer of n material is formed within the third layer. The "patterned" third layer then forms both the collector region of the current injector PNP and the shared base region of the multiple collector NPN. As before, the multiple collectors in the fourth layer are symmetrically located with respect to the base contact for matched collector current response to base control.

The cell portions, whether using X, V base region topology or rectangular base region topology, are readily iterated to form longer cells while maintaining symmetry for matched base control and symmetry for matched current injection.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

DESCRIPTION OF THE PREFERRED EMBODIMENTS

Figures 1A, 1B, 4A, 4B, 5, 7:
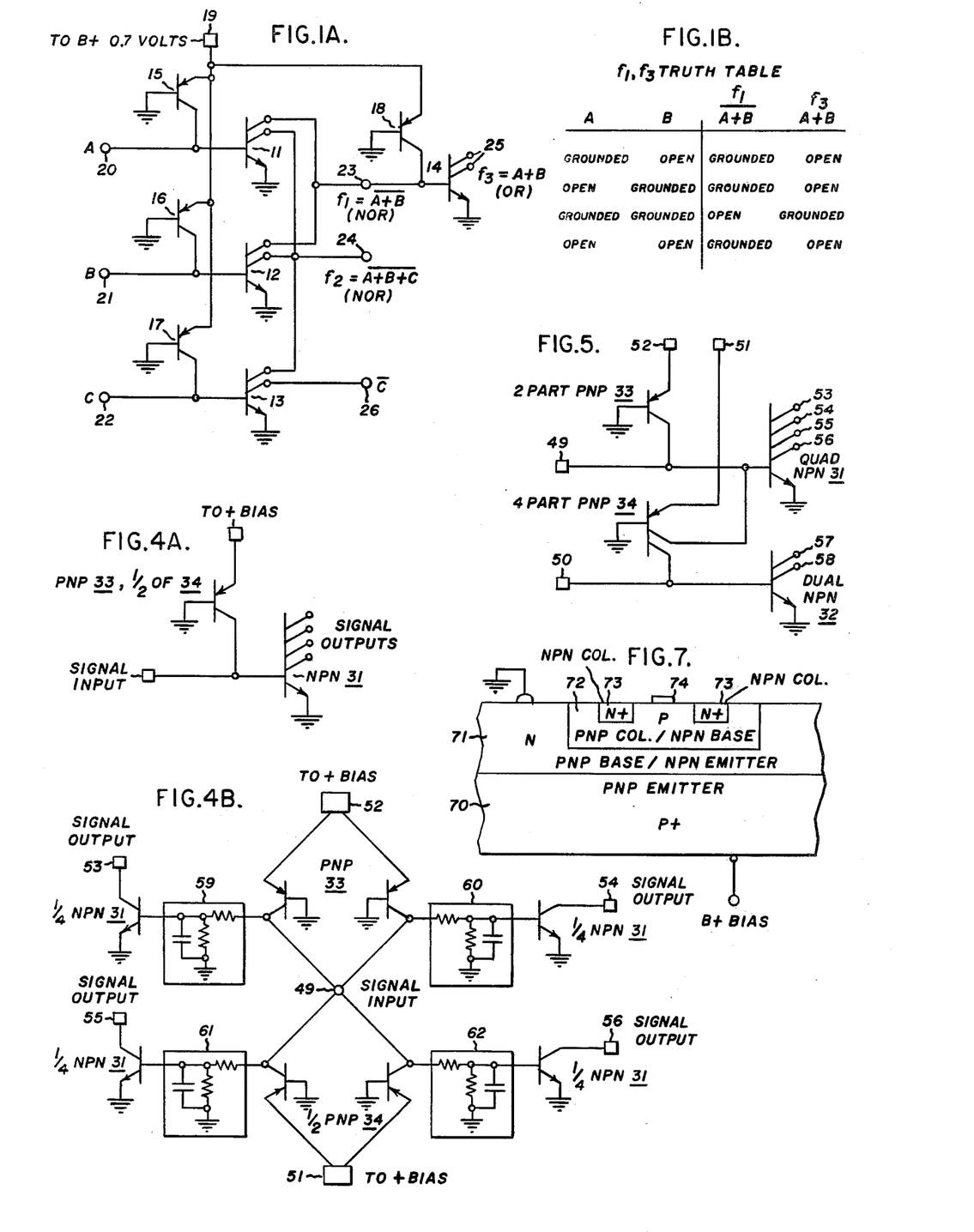
FIG. 1A is an electrical circuit diagram of I²L logic in which multiple collectors are employed to perform NOR and OR gate functions.
FIG. 1B is a truth table for the f1, f3 output functions of the circuit of FIG. 1A.
FIG. 4A is an industry standard equivalent circuit representation of the portion of the cell shown in FIG. 3.
FIG. 4B is an expanded lumped equivalent circuit representation of the same portion designed to illustrate the symmetry achieved.
FIG. 5 is a circuit diagram of the entire cell illustrated in FIG. 2 using the industry standard equivalent circuit representation.
FIG. 7 is a modified section view of a third embodiment of the invention in which current is injected in a vertical path through the substrate.

Referring now to FIG. 1A, an example of conventional integrated injection logic (I²L) is shown performing both NOR and OR gate functions. The circuit may be regarded as comprising four double collector NPN transistors (11–14) and four PNP current injection transistors (15–18), each PNP injector being associated with a selected NPN transistor. The circuit is energized by a positive bias source (not shown) of approximately 0.7 volts coupled to pad 19. The ground return of the bias source is to the substrate, illustrated by ground symbols. The logic inputs A, B and C are coupled to the terminals 20, 21 and 22 and the logic outputs are derived from four output points 23, 24, 25 and 26. The positive logic functions are:

f1 at the output point 23—$\overline{A+B}$—a NOR function
f2 at output point 24—$\overline{A+B+C}$—a NOR function
f3 at output point 25—$A+B$—an OR function
output at point 26—$\overline{C}$—an inversion In FIG. 1B, the truth table for the f1 and f3 functions are shown.

Integrated injection logic is readily applied to large scale monolithic integrated circuits and can use linear bipolar fabrication processes in which the basic logic element is the multiple collector NPN transistor. Base current is supplied to the multiple collector NPN transistors, which are used in large numbers, by PNP transistors or "injectors" which are widely distributed among the NPN transistors usually on a one for one or one for two basis. As shown in FIG. 1A, each PNP current injector is shown associated with a single NPN multiple collector transistor, and the full circuit in FIG. 1A is a collection of four of these elemental circuit combinations. This combination of a multiple collector NPN and the associated PNP injectors form the elemental circuit unit which is used repetitively in a larger integrated circuit.

The elemental PNP-NPN circuit combination is connected in the following manner. The emitter of PNP transistor (15) is connected to the positive source terminal 19, while the PNP base is grounded to provide a normal forward bias. The PNP collector is shown electrically connected to the base of NPN transistor 11, which has two collectors. The collector to base connection is "virtual" since a continuous p layer serves as both the collector of the PNP transistor 15 and as the base of NPN transistor 11. The PNP base current supply transistors are normally called "injectors." The emitter of the NPN 11 is grounded and the two collectors of the NPN 11 are coupled to the output terminals 23 and 24, respectively. Each NPN collector is coupled (by means not shown in each case) to a small positive potential (0.5 volts typically) through a succeeding current source (e.g., the collector of PNP transistor 18).

The elemental circuit provides an input to output logic inversion. When the A input applied to the input terminal 20 is in the "off" condition, corresponding to returning the terminal 20 through a large impedance to ground, the PNP transistor, which is near saturation under this condition and thus not strongly conductive, supplies base current to the NPN transistors and current flows in both collectors of NPN transistor 11. Collector current flow in the NPN transistor reduces the potential at terminal 23, corresponding to an "on" (low output impedance) output state for f1 at terminal 23. When the input A applied to input terminal 20 is in the "on" condition, corresponding to grounding the terminal through a low impedance, the current available from the PNP transistor 15 is diverted from the base of NPN transistor 11 turning it off. The PNP transistor is brought out of near saturation and conducts more strongly than before into the diversionary load. With the NPN transistor 11 off, the potential at terminal 23 is approximately +0.5 volts (provided that NPN transistor 12 is also off). Under these conditions, the A input is normally characterized as "ON" and the 11 output "OFF". Similarly, the NPN transistor 13 produces an inversion ($\overline{C}$) of the input C applied to the input terminal 23 at the output terminal 26. This function is not affected by the state of the other NPN transistors in the circuit. Regardless of which logical designation is applied to a state, the input logic state at the base produces the inverse state at each collector of the device.

The logic functions of the total circuit are NOR or OR functions in accordance with the partial truth table of FIG. 1B. One must only assume that the individual collectors of each NPN are isolated. If an "OFF" signal (high input impedance) is applied to terminal 20, the NPN transistor 11 is turned on resulting in a low output impedance condition at terminal 23 corresponding to an "ON" output state. Conversely, if an "ON" signal (low input impedance) is applied to terminal 20, the NPN transistor 11 is turned off resulting in a high output impedance, and possible "OFF" condition at terminal 23. If either A or B or both are "OFF", the "ON" output state at 23 occurs. If both A and B are "ON", the "OFF" output state at 23 occurs. The output function at 23 is the positive logic NOR function, which is represented as $\overline{A+B}$. At terminal 25 a further inversion occurs. As indicated by the truth table, the function (f3) at this point corresponds to the OR function which is represented as $A+B$ relative to the original inputs.

Figure 2:
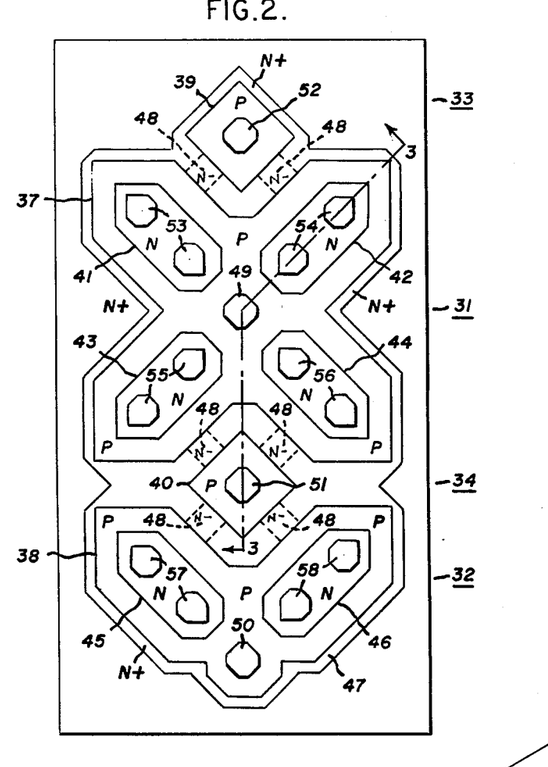
FIG. 2 illustrates the topology of a practical cell for implementing I²L logic on an n type silicon substrate and showing an exemplary double and quadruple collector NPN transistor means. In this embodiment, which uses X and V shaped areas for the NPN devices, symmetry is maintained between the individual collectors and the means for base current control and current injection.

A plan view of a practical cell for implementing I²L logic is shown in FIG. 2. It incorporates inventive features designed to achieve uniform output response at the different collectors of the NPN transistors. In the FIG. 2 embodiment, a four collector NPN transistor is shown at 31; a two collector NPN transistor is shown at 32; and two PNP base current injection transistors are shown at 33 and 34, respectively. The drawing has been simplified for ease in understanding by eliminating the conductor runs to the contacts. The vertical detail of the cell is best understood by considering FIG. 3, which is a sectioned perspective view while FIGS. 4A and 4B are directed to the electrical operation by means of equivalent circuit representations of the portion of the cell represented in FIG. 3.

Continuing, the exemplary cell is formed in the epitaxial layer 36 applied to an N+type substrate 35 of suitable conductivity for providing the common ground contact. In a practical embodiment, the cell is 0.005" in width by 0.010" in length and a single substrate may incorporate larger numbers (10 to 1000) of cells, depending on the complexity of the function sought. Costs normally preclude individual substrates from exceeding $\frac{1}{4}'' \times \frac{1}{4}''$ and set upper limits on the total number of cells.

The illustrated cell is one which may be used repetitively, but the more fundamental smaller unit is a multiple collector NPN and the associated current injection PNP(s). These smaller units may take several forms in which both topology and the number of collectors may vary. The illustrated cell provides one quadruple ("quad") or four collector NPN transistor 31, one "dual" or two collector NPN transistor 32 and the associated PNP current injectors 33, 34. Other forms of cells may contain pluralities of dual units, pluralities of quad units, or assorted combinations of one unit with the other, since the dual units closely match the quad units. In some cases, the input and output sections are dual units, while the quad units are used iteratively at intermediate states in the logic. In many cases, where less than two or less than four collectors are sought, the diffusion topology illustrated in FIG. 2 may be preserved, to preserve the similarity in electrical characteristics, while unused regions are left inactive by omitting external contacts.

The NPN transistors 31, 32 are "vertical" transistors, while the PNP injectors 33, 34 are laterally formed. The term "vertical" implies that the NPN transistors 31 and 32 are formed of a vertical succession of horizontal regions. The emitter region of the NPN transistor is formed undermost and the collector region uppermost, which is the inverse of the usual order in conventional vertically developed transistors. The multiple collectors are formed in isolated regions, a construction which is common to the I²L approach. The PNP injectors 33 and 34 use base, emitter and collector regions which are disposed side by side or "laterally".

Figure 3:
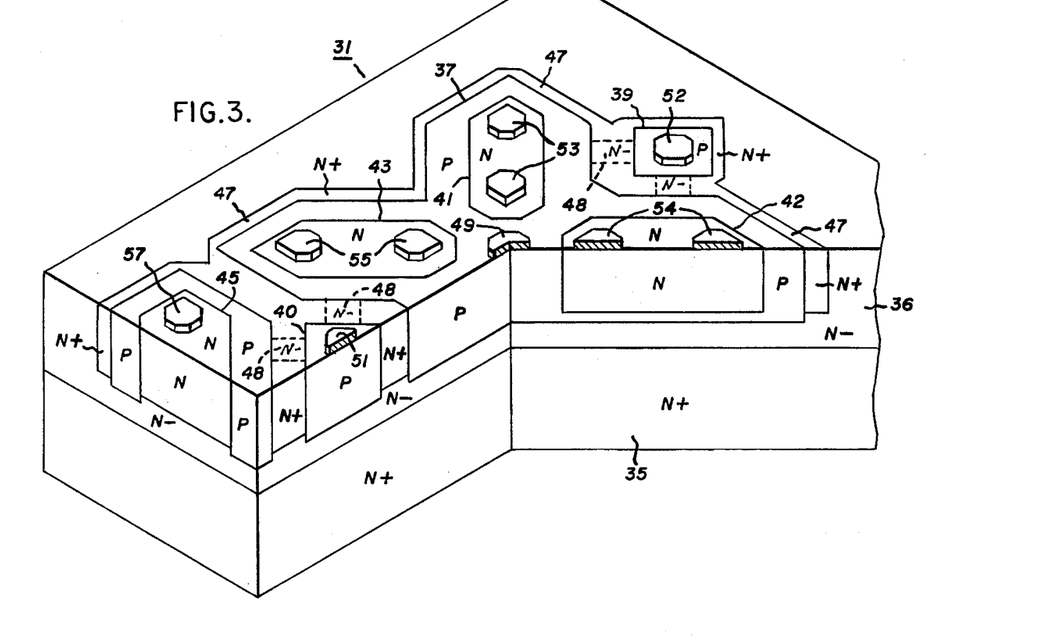
FIG. 3 is a sectioned perspective view of a portion of the cell illustrated in FIG. 2 showing the contacts and internal semiconductor layers of the four collector transistor means and two of the associated PNP current injection transistors.

The construction of the cell and three individual transistor devices making up the cell may be seen in the sectioned perspective view of FIG. 3. The original substrate 35, typically 0.010" thick, and of degeneratively doped (n+) silicon, has an ohmic contact (not shown) on its lower surface and a thin epitaxial layer of lightly doped (n−) silicon on its upper surface in which layer the emitter, base and collector regions of both the NPN and PNP devices are formed. In FIG. 3, the vertical scale of the epitaxial layer and the diffusions into that layer has been increased for clarity in depicting the vertical detail. The substrate is 250 microns thick, while the epitaxial layer is 3.8 microns thick. Similarly, while the epitaxial layer is 3.8 microns thick, the largest diagonal dimension of the NPN transistor 33 is 140 microns. In substance, discounting the substrate contact region, the NPN is smaller in the vertical dimension and larger in the horizontal dimension than shown, leading to comparatively short vertical current paths and long horizontal current paths. The layer 35 provides a high conductivity ohmic contact for the n− diffusion 36 laying next above it. The n− diffusion (36) is at the original doping level at which the epitaxial layer was grown. The original doping continues through to the upper surface of the epitaxial layer except where interrupted by subsequent, shallower diffusions formed into the top. As illustrated, the shallow p-type diffusions occur in four separate locations 37, 38, 39 and 40, corresponding respectively to the sites of the NPN quad transistor 32, the PNP injectors 33 and 34. In the plan view of FIG. 2, the p diffusion 37 is "X" shaped and contains four n-type islands (41–44), the p diffusion 38 is "V" shaped and contains two n type islands (45, 46) the p diffusions 39 and 40 are square and contain no islands. All diffusions (41–46) are formed at the same time to a depth of approximately 2.8 microns. The n type diffusion just referred to is formed into the top surface of the epitaxy and is shallower (2.5 microns) than the p type diffusion. The final n diffusion is strongly conductive (n+) and defines both the sites of the multiple collectors of the NPN devices and guard rings 47 around the devices. The n type islands are surrounded on the sides and bottom by p type material and are thus isolated from any other regions. The n type diffusion also forms the guard ring 47 which surrounds the cell and each device (31, 32)—except where injection paths 48 between PNP and NPN devices are preserved.

After the last deposition, the contacts (shown as shaded regions in FIG. 2) are applied to the top surface of the chip. The collector contacts for the six n type collector regions are shown at 53-58. Double collector contacts are shown for ease in routing interconnections over the surface of the integrated circuit. In accordance with the invention, the collector regions (41-48) of the quad NPN transistor 31 are arranged equidistant from a first center of symmetry at which the base contact 49 is placed. Similarly, the base contact 50 of the dual NPN transistor 32 is symmetrically arranged with respect to the collector regions 45, 46 of the dual transistor. In the dual transistor, the dimensioning of the quad transistor is repeated.

FIG. 2 also illustrates the symmetry between the NPN transistor and PNP injectors. In particular, one pair of collector regions 43, 44 from the NPN device 31, and one pair of collector regions 45, 46 from the NPN device 32 are arranged at equal distances from a second center of symmetry at which the PNP injector 40 is placed. Similarly the injector 33 is symmetrically placed with respect to the remaining pair of collector regions 41, 42 from the NPN device 31.

As previously noted, the NPN transistor 31 is a vertically developed, four collector device with the emitter beneath and the collector on top. Its construction will now be further described. The active portion of the emitter of the NPN transistor 31 may be regarded to be the portion of the n− diffusion 36, located beneath the "X" shaped p diffusion 37 forming the base region of the NPN transistor 31. The most active portions of the NPN emitter are the four smaller rectangular regions directly beneath the four n type collector diffusions 41, 42, 43 and 44. The base of the NPN transistor 31 may be regarded as the entire "X" shaped p diffusion 37, but the primary area of activity is the smaller region beneath the four n type collector diffusions 41, 42, 43, 44. In short, the central portion of the base region provides a passive signal path between the central base contact 49 and the smaller active portions of the base region located beneath the n type collector diffusions. Due to the extreme thinness of the vertical diffusions and the accompanying fields, the currents characteristic of transistor action flow primarily in a vertical direction. Due to the localized nature of the collector diffusions and the high conductivity of the n+ emitter contact, the active regions (e.g., current multiplication sites) of the NPN transistors from a high frequency standpoint are restricted to the small regions beneath the collector diffusion. The circuit diagram of NPN transistor 31 in FIG. 4A, which is the industry standard equivalent representation, shows only the electrical isolation of the four collectors and treats the base as unitary and the emitter as unitary. This equivalent representation is consistent with the fact that separate connections need only be made to each collector but generally ignores the separation of the device into four active regions and ignores the long horizontal paths through the base diffusion by which the base signal drive is supplied in each active region. The expanded equivalent circuit represention of FIG. 4B shows these omitted characteristics as well as an approximation of the topological symmetry.

In accordance with the invention, the base contact is symmetrically placed in respect to the collector diffusions of the multiple collector NPN (or in respect to the sites of the vertical NPNs which are formed under the collector diffusions). The effect is to equalize both the d.c. and the transient response of all four collectors to a base applied control signal as will now be seen from a further consideration of the four collector device.

The symmetrical placement of the base contact in respect to the collectors achieves equalized collector input signal response and produces an improvement over prior art devices. The emitter contact to the emitter region is very short, since the emitter region is very thin and the n+ emitter contact diffusion provides a relatively high conductivity ground plane. The collector region, as earlier noted, is both thin and of small lateral extent. Thus, the collector contacts on top of the epitaxy are close to the active junction region. Thus, neither emitter nor collector contacts produce appreciable delays, nor contribute appreciably to device asymmetry. The base contact, on the other hand, due to the large lateral extent of the quad transistor requires long horizontal current paths from the contact (49) to the four active regions of the base. The lateral base paths are an order of magnitude larger than the signal paths from collector contact to collector junction, or emitter contact to emitter junction. Since the base region is of relatively low conductivity, there is also a substantial series base resistance. Thus, in I²L geometry, the problem of asymmetry arises primarily with respect to the base. The common practice is to form the collector regions in a straight line in an elongated base region and to place the base contact at one end of the base region. This approach leads to a variation in distance and resistance from the common base contact to each collector region, and produces the observed variation in signal response from collector to collector. Thus, variation is avoided by using a symmetrically placed base contact which achieves near perfect symmetry between the base and the individual collectors of the quad transistors. In removing asymmetry in the base signal paths, a major source of collector to collector variation is removed, and circuit performance is greatly improved over that of the conventional construction.

The advantage of base contact symmetry may also be explained by reference to the expanded equivalent circuit representation of FIG. 4B. In FIG. 4B only the portion of the cell illustrated in FIG. 2 corresponding to the quad NPN 31, the PNP injector 33 and half the PNP injector 34 are shown. In short, it is an expanded version of the same portion of the circuit shown in FIG. 4A. The four individual vertical NPN sections are shown at four cornerrs of an imaginary square whose corners are defined by the collector contacts 53, 54, 55 and 56. The base contact shown at 49 is at the center of this rectangular region. The signal path from the base contact 49 to the base region of each of the four vertical NPN sections includes a loss element 59, 60, 61 and 62, respctively. Each loss element can be modeled as a series resistive element coupled between the common base terminal 49 and the associated base region of the NPN and an RC parallel shunt to ground at the base region. When the geometry between the contact 49 and each base region is made symmetrical, then the three components making up the loss element are equalized and both dc and transient response to the base contact 49 are matched. The components of the loss element may be regarded as forming a delay line section. When they are identical, the delays from the base contact to the four transistor sections in the symmetrical configuration are matched. Should the geometry place the devices in a row, the delay sections are no longer fanned out, single sections, but are instead cascaded, with each successive base region receiving the signal a full section delay later. In this known geometry, the remote, fourth collector is three delay sections away from the base contact and experiences significantly greater delay than the nearest, first collector which is only one delay section away from the base contact.

A further novel aspect of the invention is in respect to the symmetry achieved between the PNP current injectors and the individual base regions. As a necessary preliminary to taking up this aspect of the invention, the dual collector transistor 32 will be discussed. While the dual transistor 32 is not shown in the sectioned perspective view of FIG. 3, it is of similar construction to the quad transistor 31, and has a similar plan view as shown in FIG. 2, except for the absence of two collector regions and the accompanying base extensions. For instance, the base contact 50 has the same lateral disposition in relation to the collector diffusions 45 and 46 in transistor means 32 as in the transistor means 31 and the vertical dimensions of the diffusions of the two transistors are identical. An n+ guard ring 47 is provided around the dual transistor 32. It resembles the guard ring bearing the same reference numeral encircling the quad transistor 31. The quad transistor 31 has an "X" shaped geometry in which the linear elements of the X (formed by the p diffusions) are of equal length and intersect at their mid points at right angles. The dual transistor 32 has a V shaped geometry in which the linear elements of the V (formed by the p diffusion) are of equal length—one half the linear elements of the Xs, and intersect at their end points normally at right angles. In other words, the p diffusions for the dual and quad NPN may be regarded as having a central hub and either two or four arms of equal length radiating from the hub. The geometry is chosen so that the base contact to the active collector region is the same for both collectors in dual transistor 32, and equal to the same measurement in quad transistor 31. In short, the geometry of both the dual and the quad transistors are closely matched, and as a consequence, their signal properties are also matched.

The use of adjacent quad and dual transistor devices, adjacent pairs of quad devices, or adjacent pairs of dual devices permits a further useful symmetry in base current injection. As illustrated in FIG. 2, the X-shaped quad transistor 31 and the V-shaped dual transistor 32 are positioned to define a square region between them. This is done by arranging the interior corner of the V to face an angle of the X. The distances between the corner of the V and the intersection of the X are then made equal to the other diagonal of the opening defined by the p diffusions to form a square between them. In arranging the four arms of the p diffusions to form a square, a second point of symmetry is created from which four matching lateral current injection paths may originate. In accordance with the invention, the lateral current injection paths are equalized in regard to the lower base regions of the quad transistor and both base regions of the dual transistor by placing the current injection means at this second point of symmetry. To complete the base current injection for the quad transistor 31 a second current injector 34 is provided similar to the first except that it supplies base current bias only for the two upper base regions. Accordingly, it has only two matching lateral current injection paths for that purpose and has only half the current injection capacity of the first injector (33). The upper half of the quad transistor 31 creates a third point of symmetry from which matched base current injection paths are possible to the upper base regions. In short, the geometry permits the matching of all six lateral base current injection paths in the cell.

The construction of the NPN current injection means 34 may be understood in connection with FIGS. 2, 3 and 4. In the plan view of FIG. 2, the current injection means 34 is positioned in the square area whose boundaries are four arms of two facing p diffusions (37, 38). The means 34 includes four distinct current paths, each originating at the center of the square and each via separate input and output junction regions terminating within a portion of the bounding p diffusions. The current injection means 34 is a four transistor device in principle, since it has four separated active transistor regions corresponding to the four current paths to the facing p diffusions. With some inaccuracy, however, it may also be regarded as a unified device due to the shared connections to the emitter, base and collector regions. The shared connections justify the equivalent circuit diagram of FIG. 4A—the conventional representation—in which only a single emitter, base and collector element are shown. The injection means 34 is a lateral device, in that in the active transistor regions, the successive base, emitter and collector regions are arranged side by side as seen in the plan view of FIG. 2. In common with known I²L logic, the p type collector regions of the PNP injector are portions of the adjoining arms of the p type diffusion, which also serves as the base regions of the adjacent NPN devices.

The formation of the PNP injection means 34 and additional details in its four part structure will now be described. The PNP device 34 is formed at the same time as the NPN devices 31 and 32. The p emitter diffusion (40) of device 34 is to the same depth below the surface of the epitaxial layer as the p diffusion forming the base of the NPNs, and the diffusion stops within the original n− epitaxial diffusion. The emitter diffusion is square in plan view, and is centered in the square region formed by the four arms of the p diffusions 37, 38 of the dual and the quad NPN transistors 31 and 32. The emitter contact 51 is applied at the center of the top surface of the emitter diffusion 40. The p emitter diffusion 40 is spaced laterally from the arms of the p diffusions 37, 38 by short, equal length gaps in which the n− material of the original epitaxial layer remains. The base regions of the injection means 34 are formed of these four short regions (48). The four regions (48) are bounded on either side by the shallow n+ guard ring 47, which except for these openings, surrounds the NPN devices and the PNP injector devices. The remaining n− region under the p type region of the PNP emitter represents a generally inactive extension of the base region, and leakage current is generally held to a minimum by holding the region thin enough (approximately 1 micron) for space charge limiting. The regions 48 thus form four substantially separate base regions linked only by the thin n− region underlying the entire device. The base contact to each PNP base region (48) is to the underlying n+ diffusion 35 forming the ground contact. Due to the thinness of the epitaxial layer, the four base region contact paths are short, vertical and equal. Consistently with the four part PNP rationale, current is derived from the PNP emitter diffusion 40 in four separate paths from four separate input junctions. Consistently with the standard equivalent circuit representation (FIG. 4A), only a single contact 51 is provided to the p type emitter diffusion 40. Also consistently with the standard equivalent circuit representation, all base region (48) contacts, although through separate paths, are made to the common ground contact (35).

Continuing, the injection means 34 has four corresponding output junction regions in further support of four part treatment. The four separate base regions (48) mentioned above abut separate arms of the p diffusions 37, 38, at which four separate output junctions are formed. The abutting portions of each arm of the p diffusions 37, 38 form four separate collector regions. The injector current flows through each of the four output junction regions of the PNP and continues through the p diffusions (37, 38) to the nearest vertical NPN. In respect to the lower left arm of the p diffusion 37, for instance, the current is injected from the portion of that arm facing the upper left PNP base region (48) of the PNP 34 and continues to flow in the same direction toward the vertical NPN under collector diffusion 43. In principle, some injector current may not follow this path, and may flow to the not so proximate vertical NPN. Due to the appreciable resistivity of the p layer 37, the base currents diverted to the non-proximate NPN regions is small, and may normally be neglected.

Consistently with a partitioned injector, a plurality of like, but separate, current paths exist between each output junction region of each PNP and an adjacent active region of each NPN. In respect to PNP injector means 34, four separate current paths exist between four PNP output junction regions, respectively, and the two lower active regions of the NPN quad transistor 31 and the two active regions of the dual NPN transistor 32. In respect to the PNP injection means 33, two separate current paths exist between two PNP output junction regions respectively and the two upper active regions of the NPN quad transistor.

The expanded equivalent circuit representation of FIG. 4B is in accordance with the foregoing partitioned explanation of each injection means. The circuit is however restricted to the portions of the injectors 33 and 34 supplying the quad NPN 31. The injector 33, not previously discussed in detail, is a two part current source and similar in construction to the injector 34 which is a four part current source.

The standard industry equivalent circuit for the cell in FIG. 2 is shown in FIG. 5. In it the external pads are shown, but the partitioning earlier discussed omitted except for the collector regions of the NPN devices and the PNP injector 34. The PNP injector is shown as a two collector device justified by the connections to the separate NPN devices.

In operation, the symmetry in geometry between each of the active regions of the NPNs and the associated part of the PNP current source, leads to close matching of the base bias currents, in addition to like transient response. An important consideration in achieving uniformity of output response is equality in conduction when the separate collectors are conductive (in their low output impedance state). In operation of an I²L cell, the input signal assumes one of two binary levels. The first designed to turn off the device and the other designed to permit device conduction. Matching the non-conductive states is normally not critical in dc operation, while matching the conductive states is critical. In practical forms of the present invention using symmetric topology, low current level matching (around 200 microamperes) is to an accuracy range of about 15%, while conventional topology produces an accuracy range of 80%. At higher current levels (around 1,000 microamperes) the accuracy range using the novel symmetric topology is from 6% to 12%, while conventional topology produces an accuracy range of 160%. Accordingly, a substantial improvement in dc performance is achieved by use of the novel symmetry topology. The dynamic response of the circuit as reflected in turn-on and turn-off times is also important. In practical forms of the present invention (using both base contact and injector symmetry), the delay performance from collector to collector of the same NPN device is typically 10%. In conventional topology (in which four collectors are connected in a row) the delay may vary by a factor of three (300%) between the collector nearest to and furthest from the base contact and the injector.

Figure 6:
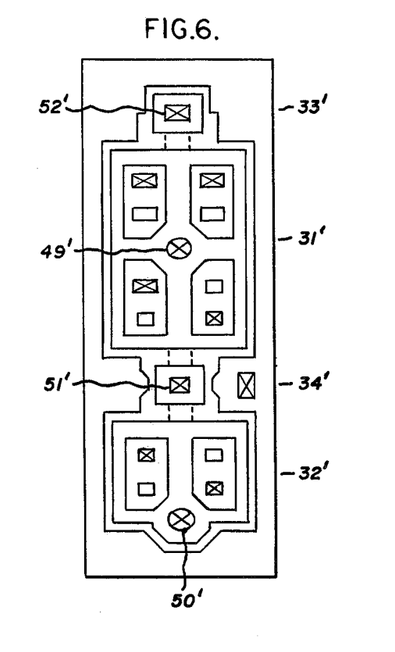
FIG. 6 illustrates the topology of a second practical cell having the same circuit as illustrated in FIG. 5, but using an approximately rectangular topology for the multiple collector NPN transistor means.

The X and V shaped topology of the FIG. 2 embodiment is one of several practical forms of the invention. In FIG. 6, a second topology is shown also possessing base contact and injector symmetry. In this figure, a quad NPN device 31', a dual NPN device 32', a one part injector 33', and a two part injector 34' are also present as in the cell illustrated in FIG. 2. The devices are electrically interconnected in the same manner and may be regarded as corresponding to the standard equivalent circuit representation shown in FIG. 5. In FIG. 6, the quad NPN device 31' is an elongated rectangle, while the dual NPN is also a rectangle, but of half the area of the first. The two rectangles are arranged side by side with their axes coincident. The four devices 33', 31', 34' and 32' are then aligned in that order in a single row on a common axis. The arrangement is such that the upper injector 33' is in close proximity to two upper active regions of the quad NPN. The two lower active regions of the quad NPN are adjacent injector 34'. On the remote side of the two part injector 34', the dual NPN device 32' is arranged. The base contact 49' is arranged at a central location in the quad NPN device, equidistant from each vertical NPN section. The base contact 50' for the dual NPN 32' is placed below the two active regions of the dual NPN also at an equal distance from each vertical NPN section, and in such a way that the distances between active NPN regions and base contact are the same for dual and quad NPN devices. From this it may be seen that the six active regions of the dual and the quad NPNs are symmetrically disposed with respect to their respective base contacts 49' and 50'.

The separate injection paths from each injector to the associated active regions of the NPN transistors are matched in the FIG. 6 topology. A difference between the FIG. 6 and the FIG. 2 arrangement is that the injection means 33' for the upper pair of active regions possesses a single active base region, and is thus essentially a one part device whereas in the FIG. 2 arrangement, there are two active base regions. Similarly, the injector 34' possesses a single active base region leading to the lower pair of active regions of the quad NPN transistor and a single active base region leading to the lower two active regions of the dual transistor 32', whereas in the FIG. 2 arrangement, there are four such active base regions. The FIG. 6 arrangement thus reproduces the two symmetries between base contact and injectors possessed by the FIG. 2 topology.

A third form of the invention is shown in FIG. 7 in a section view using substrate feed or vertical PNP injection. In this embodiment, the individual NPN collector regions are symmetrically arranged about their base contacts as above. However, the injection is achieved by use of the underlying portions of the substrate and takes place in a vertical direction. In particular, the original substrate 70 is of p+ material to which an n doped epitaxial layer 71 is applied. A p diffusion 72 into the top surface is used to form the base region of the NPN devices and as will be seen, the collector region of the PNP current injector. The collector regions 73 of the NPN devices are formed by a n+ diffusion into the p region 72. A symmetrically placed NPN base contact is shown at 74. The vertical PNP current injection device is formed from the successive layers 70, 71 and 72 which form respectively the emitter, base and collector regions. The internal injection paths in this arrangement are vertical and thus generally short. In general, a fairly close match may be achieved between the current injection properties at the base regions of the individual NPN sections. Base contact symmetry is equally beneficial to this configuration.

The symmetrical topologies so far described have involved two and four incremental NPN transistors symmetrically located relative to the same contact. One may also use other numbers such as 3 or higher numbers. Significantly higher numbers may be practical as photolithographic resolution improves in the industry. In the substrate fed form of I$^2$L, this would be a natural evolution to 5, 6, 7, 8, etc. collectors all symmetrically located relative to the base contact. Where lateral forms of PNP injectors are used, the incremental NPN transistors must also be symmetrically located relative to the PNP emitter region. In this case, an additional PNP emitter may be added for each additional pair of incremental NPN transistors.

The symmetrical design techniques described here have a significant effect on the matching of output responses especially at high current levels and fast switching speeds.

Symmetry also gives the circuits added radiation immunity. Neutron and gamma irradiation of I$^2$L circuits has the effect of increasing both the effective decoupling between adjacent intrinsic NPN transistors and the shunt charge loss effects within each incremental section of a logic gate. With increased penalties due to asymmetry from radiation, symmetrical design techniques have a very major effect on achieving radiation immunity. In order to maintain correct operation, an I$^2$L logic gate must have greater than unity gain but the designer may leave ample margin between the initial value and unity gain to preserve circuit operation with large amounts of radiation. The initial gain at fabrication is generally quite uniform ($\pm 5\%$) at some specific value in the 5–30 range. The radiation immunity improvement is a result of the fact that the effective gain of all the incremental devices in the symmetrical cells degrade uniformly with irradiation. In the conventional in-line topography, however, the "far collector" degrades much more rapidly than the "near" collectors as a function of accumulated total irradiation. A factor of three improvement in total neutron fluence immunity and a factor of at least 20 improvement in gamma "dose" immunity has been achieved as a result of the topographic improvements herein described.

What is claimed as new and desired to be secured by Letters Patent of the United States is:

1. In a monolithic integrated injection logic circuit, the combination comprising:
   (a) at least a first, second, and third vertical transistor means formed on a substrate, each comprising:
      (1) a first emitter region of a first polarity material,
      (2) a first base region of a second polarity material lying above and next to said first emitter region to form an input junction,
      (3) a plurality of separate first collector regions of a material of said first polarity, disposed on top of and horizontally bounded by a continuation of the material of which said first base region is formed so as to form a plurality of separate output junction regions and a like plurality of incremental vertical transistors localized under said collector regions, said first collector regions being arranged at substantially equal horizontal distances from a first center of symmetry, and
      (4) a base contact applied to said base region near said center of symmetry for matched collector current response to base control, and (b) complementary transistor means formed on said substrate for injecting base current into said vertical transistor means in substantially equal paths to each incremental vertical transistor, comprising:
  (1) a second emitter region of a material of said second polarity,
  (2) a second base region of a material of said first polarity next to said second emitter region to form at least one input junction,
  (3) a second collector region of a material of said second polarity next to said second base region to form at least one injector output junction and formed as a continuation of the material of which said first base region is formed for base current injection to said vertical transistor means, and
(c) means connecting a first collector region of each of said first and second vertical transistor means to the first base region of said third vertical transistor means.

2. The combination set forth in claim 1 wherein:
said second emitter, second base and second collector regions of said complementary transistor means are vertically oriented in respect to said substrate to provide vertical current injection paths to said vertical transistor means.

3. The combination set forth in claim 1 wherein:
said second emitter, second base and second collector regions of said complementary transistor means are horizontally oriented in respect to said substrate to provide horizontal current injection paths to said vertical transistor means.

4. The combination set forth in claim 3 wherein:
(a) one of said vertical transistor means has at least three incremental transistors and wherein:
(b) said complementary transistor means comprises a plurality of injection transistors, each providing horizontal current injection to at least one of said incremental transistors, each current injection transistor being equally spaced from its respective incremental transistor to match said current injection.

5. The combination set forth in claim 3 wherein:
(a) one of said vertical transistor means has four incremental transistors, and wherein:
(b) said complementary transistor means comprises:
  (1) a first injection transistor providing horizontal current injection to a first adjacent pair of said incremental transistors, and
  (2) a second injection transistor providing horizontal current injection to the second adjacent pair of incremental transistors,
said first and second current injection transistors being equally spaced from said respective incremental transistors to match said current injection.

6. The combination set forth in claim 3 wherein:
(a) at least two of said vertical transistor means are provided in close horizontal association on said substrate with at least three incremental transistors disposed at substantially equal horizontal distances from a second center of symmetry,
(b) said complementary transistor means being disposed near said second center of symmetry to provide matched horizontal current injection to said incremental transistors.

7. The combination set forth in claim 6 wherein:
two of said horizontally associated vertical transistor means each comprise at least two incremental transistors with four incremental transistors disposed at substantially equal horizontal distances from said second center of symmetry.

8. The combination set forth in claim 7 wherein:
the base regions of said two vertical transistor means are approximately rectangular, and an axis of each rectangle and said two centers of symmetry are aligned on a common axis.

9. The combination set forth in claim 3 wherein
(a) one of said vertical transistor means has at least two pairs of incremental transistors, and wherein:
(b) said complementary transistor means comprises:
  (1) a first injection transistor having at least two substantially separate base regions to form separate injector output junction regions and provide a first pair of horizontal current injection paths to a first adjacent pair of said incremental transistors, and
  (2) a second injection transistor having at least two substantially separate base regions to form separate output junction regions and provide a second pair of horizontal current injection paths to a second adjacent pair of incremental transistors,
said injection transistors being placed equidistant from the associated pairs of incremental transistors to equalize the current injection path.

10. The combination set forth in claim 9 wherein:
(a) the base region of said vertical transistor means is X-shaped, having four arms radiating from said first center of symmetry, a collector region disposed in each arm and the base contact disposed at the center of said "X," and
(b) said first and second injection transistors are centered respectively in the opposite angles of said "X."

11. The combination set forth in claim 3 wherein:
(a) two of said vertical transistor means are provided in close horizontal association on said substrate, each transistor means comprising at least one pair of incremental transistors,
(b) one pair of said incremental transistors from each vertical transistor means being disposed at substantially equal horizontal distances from a second center of symmetry,
(c) said complementary transistor means having at least four substantially separate base regions to form four separate output junction regions and provide two pairs of horizontal current injection paths originating near said said second center of symmetry.

12. The combination set forth in claim 11 wherein:
(a) the base regions of said vertical transistor means each comprise two incremental transistors; both V-shaped, with the angles of said V-shaped base regions adjoined to define a rhombus or square whose center is said second center of symmetry,
(b) said base contacts being disposed at the corners of said V's.

13. The combination set forth in claim 11 wherein:
(a) the base regions of said vertical transistor means each comprise two incremental transistors; one X-shaped and the other V-shaped with the angles of said base regions being adjoined to define a rhombus or square whose center is said second center of symmetry,
(b) said base contacts being disposed at the corners of said V's.

* * * * *